(12) United States Patent
Anderson et al.

(10) Patent No.: US 10,625,378 B2
(45) Date of Patent: Apr. 21, 2020

(54) RAPIDLY SOLIDIFYING PB-FREE SN-AG-CU-AL OR SN-CU-AL SOLDER

(71) Applicant: Iowa State University Research Foundation, Inc., Ames, IA (US)

(72) Inventors: Iver E. Anderson, Ames, IA (US); Kathlene Nicole Reeve, Lafayette, IN (US)

(73) Assignee: Iowa State University Research Foundation, Inc., Ames, IA (US)

( * ) Notice: Subject to any disclaimer, the term of this patent is extended or adjusted under 35 U.S.C. 154(b) by 651 days.

(21) Appl. No.: 13/999,284

(22) Filed: Feb. 6, 2014

(65) Prior Publication Data

US 2014/0158423 A1 Jun. 12, 2014

Related U.S. Application Data

(63) Continuation-in-part of application No. 13/066,748, filed on Apr. 22, 2011, now abandoned.
(Continued)

(51) Int. Cl.
*B23K 35/26* (2006.01)
*C22C 13/00* (2006.01)
(Continued)

(52) U.S. Cl.
CPC .......... *B23K 35/262* (2013.01); *B23K 35/001* (2013.01); *B23K 35/025* (2013.01); *B23K 35/0222* (2013.01); *B23K 35/0244* (2013.01); *B23K 35/26* (2013.01); *B23K 35/286* (2013.01); *B23K 35/30* (2013.01); *B23K 35/302* (2013.01); *B23K 35/38* (2013.01); *B23K 35/383* (2013.01);
(Continued)

(58) Field of Classification Search
None
See application file for complete search history.

(56) References Cited

U.S. PATENT DOCUMENTS

| 5,125,574 A | 6/1992 | Anderson et al. ........... 239/8 |
| 5,228,620 A | 7/1993 | Anderson et al. ........... 239/8 |

(Continued)

FOREIGN PATENT DOCUMENTS

JP 11129091 A * 5/1999 ............. B23K 35/26

OTHER PUBLICATIONS

JP11-129091 machine translation.*
(Continued)

*Primary Examiner* — Paul A Wartalowicz
*Assistant Examiner* — Stephani Hill

(57) ABSTRACT

A solder alloy includes Sn, optional Ag, Cu, and Al wherein the solder alloy composition together with the solder alloy superheat temperature and rapid cooling rate from the superheat temperature are controlled to provide a dispersion of fine hard Cu—Al intermetallic particles in an as-solidified solder alloy microstructure wherein the particles are retained even after multiple solder reflow cycles often used in modern electronic assembly procedures to provide a particle strengthening to the solder joint microstructure as well as exert a grain refining effect on the solder joint microstructure, providing a strong, impact- and thermal aging-resistant solder joint that has beneficial microstructural features and is substantially devoid of $Ag_3Sn$ blades.

6 Claims, 3 Drawing Sheets

Related U.S. Application Data

(60) Provisional application No. 61/343,135, filed on Apr. 23, 2010.

(51) Int. Cl.

| | | |
|---|---|---|
| *B23K 35/00* | (2006.01) | |
| *B23K 35/02* | (2006.01) | |
| *B23K 35/30* | (2006.01) | |
| *B23K 35/38* | (2006.01) | |
| *B23K 35/28* | (2006.01) | |
| *H05K 3/34* | (2006.01) | |

(52) U.S. Cl.
CPC ........... *C22C 13/00* (2013.01); *H05K 3/3463* (2013.01); *H05K 2203/1121* (2013.01)

(56) References Cited

U.S. PATENT DOCUMENTS

| | | | |
|---|---|---|---|
| 5,527,628 A | 6/1996 | Anderson et al. | 428/647 |
| 6,142,382 A | 11/2000 | Ting et al. | 239/8 |
| 2004/0112478 A1* | 6/2004 | Bieler | B23K 35/262 148/538 |
| 2004/0262779 A1* | 12/2004 | Amagai | B23K 35/262 257/779 |
| 2010/0203353 A1* | 8/2010 | Anderson | B23K 35/0222 428/646 |

OTHER PUBLICATIONS

H. R. Kotadia, A. Panneerselvam, O, Mokhtari, M. A. Green, S. H. Mannan. "Massive spalling of Cu—Zn and Cu—Al intermetallic compounds at the interface between solders and Cu substrate during liquid state reaction." Journal of Applied Physics. 111, 074902 (2012).*
J.-W Yoon, S.-W. Kim, J.-M. Koo, D-G. Kim, S.-B. Jung. "Reliability investigation and interfacial reaction of ball-grid-array packages using the lead-free Sn—Cu solder." Journal of Electron Materials. vol. 33 No. 10, 2004, 1190-1199.*
A. Boesenberg, I. Anderson, J. Harringa. "Development of Sn—Ag—Cu—X solders for electronic assembly by micro-alloying with Al." Journal of Electronic Materials, vol. 41, No. 7, 2012. 1868-1881.*
H-T. Ma, J. Wang, L. Qu, N. Zhao, A. Kunwar. "A study on the physical properties and interfacial reactions with Cu substrate of rapidly solidified Sn-3.5Ag lead-free solder." Journal of Electronic Materials. vol. 42, No. 8, 2013. 2686-2695.*
A-A. Bogno, J. E. Spinelli, C. R. M. Afonso, H. Henein. "Microstructural and mechanical properties analysis of extruded Sn-0.7Cu solder alloy." J Mater Res Technol 2015 4(1) 84-92.*
M. Kamal, E.-S. Gouda. "Effect of rapid solidification on structure and properties of some lead-free solder alloys." Materials and Manufacturing Processes, 21, 2006, 736-740.*
Intel. "Ball grid array (BGA) packaging." 14. 2000 Packaging Databook. 14-1 to 14-32.*
F. Ochoa, J. J. Williams, N. Chawla. "Effects of cooling rate on the microstructure and tensile behavior of a Sn-3.5wt.%Ag Solder." Journal of Electronic Materials, vol. 32, No. 12, 2003.*
Sanpo et al. "Feedstock material considerations for thermal spray." ASM Handbook, vol. 5A, Thermal Spray Technology, 2013, 93-120. (Year: 2013).*
Koo et al. Microstructural discovery of Al addition on Sn-0.5Cu-based Pb-free solder design. Journal of Alloys and Compounds 650 (2015) 106-115. (Year: 2015).*
W. Liu et al, The Effects of Additives to SnAgCu Alloys on Microstructure and Drop Impact Relaibility of Solder Joints, JOM, 59, No. 7. 2007, pp. 26-31.
L.-W. Lin et al, Alloying moidification of Sn—Ag—Cu solders by manganese and titanium, Microelectron. Reliab. 49, 2009, pp. 235-241.
W. Liu et al, The Superior Drop Test Performance of SAC-Ti Solders and Its Mechanism. Proc. 58th Electronics Components and Technology Conference, 2008, pp. 451-458.
S.K. Kang et al, Microstructure and mechanical properties of lead-free solders and solder joints used in microelectronic applications, IBM J. Res. Dev. 49, 2005, pp. 607-620.
Anderson et al. Nucleation Control and Thermal Aging Resistance of Near-Eutectic Sn—Ag—Cu—X Solder Joints by Alloy Design, J. of Electronic Materials, vol. 38, No. 12, 2009.
A.J. Boseneberg, "Development of Al, Mn, and Zn doped Sn—Ag—Cu—X solders for electronic assembly", MS Thesis, Iowa State University, May 2011.
J.K. Walleser, "Microstructure control of Sn—Ag—Cu—X solder alloy system ", MS Thesis Iowa State University 2008.

\* cited by examiner a)

b)

RAPIDLY SOLIDIFYING PB-FREE SN-AG-CU-AL OR SN-CU-AL SOLDER

RELATED APPLICATION

This application is a continuation-in-part of copending U.S. patent application Ser. No. 13/066,748 filed Apr. 22, 2011, which claims benefit of U.S. provisional application Ser. No. 61/343,135 filed Apr. 23, 2010, the disclosures of both of which are incorporated herein by reference.

CONTRACTUAL ORIGIN OF THE INVENTION

This invention was made with government support under Contract No. DE-AC02-07CH11358 awarded by the U.S. Department of Energy. The government has certain rights in the invention.

FIELD OF THE INVENTION

The present invention relates to a method of rapidly solidifying a Pb-free solder alloy (Sn—Ag—Cu—Al or Sn—Cu—Al) and resulting solder product that displays reliable joint solidification control to provide a strong, impact- and thermal aging-resistant solder joint having beneficial microstructural features and substantially devoid of $Ag_3Sn$ blades and that is useful for joining electronic assemblies and electrical contacts and to substitute for Pb-containing solders in all surface mount solder assembly operations, including solder paste reflow and ball grid array joints.

BACKGROUND OF THE INVENTION

The global electronic assembly community is striving to accommodate the replacement of Pb-containing solders, primarily Sn—Pb alloys, with Pb-free solders due to environmental regulations and market pressures. During this major transition away from eutectic or near-eutectic Sn—Pb solder ($T_{eut}$=183° C.) for electronic assembly, there is also the opportunity to make a major improvement in Pb-free joint reliability for challenging operating environments, i.e., high temperatures and stress levels, as well as impact loading situations. Of the Pb-free choices, an array of solder alloys based on the Sn3.7Ag-0.9Cu (in wt. %) ternary eutectic ($T_{eut}$=217° C.) composition have emerged with the most potential for broad use across the industry. U.S. Pat. No. 5,527,628 describes such Pb-free solder alloys.

The electronics industry has seized the challenge of adaptation and is proceeding rapidly to develop the assembly techniques and to generate the reliability data for tin-silver-copper (SAC) alloy solder as a favored Pb-free solder in many electronic assembly applications. Compared with Sn—Pb solders that have been limited typically to low-stress joints and reduced-temperature service because of the soft Pb phase that is prone to coarsening and ductile creep failure, the high Sn content and strong intermetallic phases of a well-designed SAC alloy solder can promote enhanced joint shear strength and creep resistance and can permit an increased operating temperature envelope for advanced electronic systems and devices.

Results of SAC alloy development have demonstrated increased shear strength at ambient temperature and elevated temperatures, e.g., 150° C. Joints made from a variety of SAC solders have also demonstrated resistance to isothermal fatigue and resistance to degradation of shear strength from thermal aging for temperature excursions up to 150° C., a current test standard for under-the-hood automotive electronics solder.

An observation that arose from initial widespread testing of SAC solder alloys was the occasional embrittlement of SAC solder joints due to micro-void nucleation, growth, and coalescence, if the exposure to elevated temperatures was sufficiently high, typically greater than about 150° C., and the exposure was sufficiently long, greater than about 500 to 1000 h (hours). This occasional joint embrittlement after thermal aging was observed at elevated Cu content in SAC solder alloys and typically was associated with excessive growth of layers of Cu-base intermetallic compounds, $Cu_6Sn_5$ and, especially, $Cu_3Sn$. It should be noted that U.S. Pat. No. 6,231,691 provides a solder to suppress this thermal aging phenomenon through minor additions (<1 wt. %, but usually 0.2-0.3 wt. %) of a fourth element, such as Ni, Fe, and/or Co, and "like-acting elements," to the SAC solder to suppress solid state diffusion at the solder/substrate interface that contains the Cu-base intermetallic compound layers. Later testing showed that a Mn addition was one of the most effective like-acting elemental additions, suppressing growth of both types of intermetallic layers after extensive thermal aging. This type of minor alloy addition to prevent embrittlement has become increasingly important since narrow solder joint gaps are becoming more common with miniaturization of electronic circuits.

Studies have shown that Sn dendrites are the dominant as-solidified microstructure feature in solder joints made with many SAC alloys, not a fine (ternary) eutectic, contrary to the previous experience with Sn—Pb. Also, it was found that relatively high but variable undercooling was observed commonly before joint solidification leading to Sn dendrites with spacing variations (that depend on undercooling and growth rate) but with very few distinct Sn grains. The unusually high undercooling of the SAC solder joints was associated with the difficulty of nucleating Sn solidification, as a pro-eutectic phase. Especially during slow cooling, e.g., in ball grid array (BGA) joints where cooling rates are less than 0.2° C./s, increased undercooling of the joints also can promote formation of undesirable pro-eutectic intermetallic phases, specifically $Ag_3Sn$ "blades," that tend to coarsen radically, leading to embrittlement of as-solidified solder joints.

References 1, 2, 3, and 4 listed below employed fourth element additions to SAC solders with the intention of avoiding $Ag_3Sn$ blades by selecting SAC compositions that were deficient in Ag and Cu, e.g., see SAC2705 [see ref. 4], SAC305, and SAC 105 [see refs. 1,2,3]. These references include the following:

1. A. W. Liu and N-C. Lee, "The Effects of Additives to SnAgCu Alloys on Microstructure and Drop Impact Reliability of Solder Joints," JOM, 59, no. 7 (2007) pp. 26-31.
2. B. L-W. Lin et al., "Alloying modification of Sn—Ag—Cu solders by manganese and titanium," Microelectron. Reliab. (2008), doi:10.1016/j.microrel.2008.10.001.
3. C. W. Liu, P. Bachorik, and N-C. Lee, "The Superior Drop Test Performance of SAC-Ti Solders and Its' Mechanism," Proc 58th Electronic Components and Technology Conf, (2008), pp. 627-635.
4. D. S. K. Kang, P. A. Lauro, D.-Y. Shih, D. W. Henderson, K. J. Puttlitz, IBM J. Res. Dev. 49(4/5), 607-620 (2005).

In these references, some marginally near-eutectic SAC alloy designs were proposed with a low Cu level (0.5%) and very low Ag levels, less than 2.7% Ag [ref. 4] and down to 1% Ag (SAC 105). These base alloys were selected since they would tend to promote Sn formation and inhibit nucleation of $Ag_3Sn$ [ref 1, 2, 3, 4]. Because these alloys deviate increasingly from the eutectic, they exhibit a wider melting range (mushy zone) with a liquidus temperature (for SAC 105) as high as 226° C. Unfortunately, some observations of unmodified SAC 105 interfacial failure on impact loading still occurred, since occasional high undercooling still may permit $Ag_3Sn$ blade formation during slow cooling. These "interfacial adhesion" failures prompted attempts at alloy modifications of SAC 105 solder with 1-2 additions [refs. 1,2] to improve impact resistance of BGA joints by increasing the interfacial bond strength of the intermetallic layer and, presumably, by suppressing $Ag_3Sn$ blade formation. While significant improvement in impact resistance was observed, especially for SAC105+0.13% Mn and SAC105+ 0.02% Ti alloys [ref. 3] (and no Ag3Sn blades were reported), their high liquidus temperature (approximately 226° C.) and wide liquid-solid mushy zone (equal to 9° C. because of the 217° C. solidus temperature) inhibits broad service application.

Copending U.S. patent application Ser. No. 13/066,748 filed Apr. 22, 2011, provides a solder alloy comprising Sn, optional Ag, Cu, and Al wherein the alloy composition is controlled to provide a strong, impact- and thermal aging-resistant solder joint having beneficial microstructural features and substantially devoid of $Ag_3Sn$ blades. The as-solidified solder joint has a microstructure that comprises tin dendrites, interdendritic multi-phase ternary eutectic, and pro-eutectic $Cu_6Sn_5$ particles adjacent and/or within the tin dendrites and is substantially devoid of $Ag_3Sn$ blades. The solder produces an as-solidified solder joint microstructure typically including an interfacial layer comprising $Cu_6Sn_5$ and an adjacent metastable Al-containing rejected solute region as a zone of intermediate hardness between the hard, brittle interfacial layer and the softer tin matrix of the solder microstructure to provide a beneficial hardness gradient that improves impact resistance. Relatively hard particles comprising Cu and Al, such as $Cu_{33}Al_{17}$, can be formed at an interfacial layer (i.e. in and/or adjacent the interfacial layer) between the copper substrate and a tin solder matrix. The solder joint can be formed by the solder being solidified on an electrical wiring board and/or about copper electrical conductors.

SUMMARY OF THE INVENTION

An embodiment of the present invention provides a method of making a rapidly solidified solder alloy comprising Sn, optional Ag, Cu, and Al, wherein the alloy composition together with the solder alloy superheat temperature and rapid cooling rate from the superheat temperature are controlled to provide a fine dispersion of relatively hard Cu—Al intermetallic particles in the as-solidified solder alloy microstructure and wherein the particles are retained even after multiple solder reflow cycles often used in modern electronic assembly procedures to provide a particle strengthening to the solder joint microstructure as well as exert a grain refining effect on the solder joint microstructure. An impact- and thermal aging-resistant solder joint having beneficial microstructural features and substantially devoid of $Ag_3Sn$ blades can be produced using the rapidly solidified solder product. The rapidly solidified solder alloy product can be rapidly solidified in the form of thin ribbon, foil, flakes, fine wire, atomized spheres (typically for BGA assemblies), atomized particles/powder (typically for solder paste), or other forms.

An illustrative method embodiment of the invention involves heating the Sn-optional Ag—Cu—Al solder alloy to a temperature above its liquidus temperature to a superheat temperature high enough, preferably at least 50 degrees C. above the liquidus temperature, to produce a homogeneous (single phase) melt. The melt then is rapidly solidified by melt spinning, gas atomization, or other rapid solidification process at a cooling rate high enough to produce an as-solidified solder alloy having a dispersion of the Cu—Al intermetallic particles, such as for example hard $Cu_{33}Al_{17}$ particles, in a rapidly solidified solder alloy matrix. The Cu—Al intermetallic particles preferably have an average maximum particle size (major dimension such as diameter) of 1 micron or less, preferably from about 0.1 to less than 1 micron average maximum particle size, even more preferably from about 0.1 to about 0.5 micron average maximum particle size. Rapid cooling rates of at least about $1 \times 10^4$ to as high as $1 \times 10^6$ degrees C./second and greater preferably are used to this end.

Such Cu—Al intermetallic particles are retained in the solder alloy microstructure even after multiple solder reflow cycles often used in modern electronic assembly procedures to provide a particle strengthening effect to the solder joint as well as exert a grain refining effect on the solder joint. An impact- and thermal aging-resistant solder joint having beneficial microstructural features and substantially devoid of $Ag_3Sn$ blades can be produced using the rapidly solidified solder.

Solder joints made with the Sn-optional Ag—Cu—Al solder alloy may need to accommodate some minor addition of Pb due to reflow and mixing with Sn—Pb component lead plating during reflow assembly of solder joints. Slight contamination by such small Pb levels is not expected to degrade the beneficial properties, such as reduced melting point (solidus or melting temperature) as well as particle strengthening/grain refining effects of the Sn—Ag—Cu—Al solder alloys of the invention and may even help improve the wettability during joint formation. This type of Pb-tolerant behavior is an advantage over competing Sn—Ag—Bi (Pb-free) solders that run the risk of generating an extremely low melting Sn—Pb—Bi ternary eutectic, if alloyed with Sn—Pb component platings. It is expected that the global supply of "legacy" electronic components with Sn—Pb solder plating will continue to diminish and eventually vanish during the current transition to full Pb-free electronic soldering, but this possibility must be tolerated in any new Pb-free solders that are proposed.

The beneficial properties of the rapidly solidified solder alloy embodiments of the invention provide advantages for solder assembly of electronic circuits and electrical systems. In the type of solder paste reflow and ball grid array (BGA) applications that are envisioned for use with the Sn—Ag—Cu—Al solder, every single degree of reduced reflow temperature is a precious advantage for reducing damage to temperature sensitive electronic components and to the circuit board material, itself. In fact, a reason that SAC solder came into broad use as a Pb-free alternative to Sn—Pb solder is that the minimum reflow temperature of SAC solder for most applications, about 240° C., is just below the threshold for significant damage of one of the most popular circuit board materials, a fiberglass/epoxy composite, i.e., FR-4. Thus, the rapidly solidified Sn—Ag—Cu—Al solder alloy pursuant to the present invention should permit a more comfortable margin for preventing thermal damage of most components and common circuit board materials while producing an impact- and thermal aging-resistant solder joint having beneficial microstructural features discussed above and substantially devoid of $Ag_3Sn$ blades.

The above advantages of the invention will become more readily apparent from the following detailed description taken with the following drawings.

DESCRIPTION OF THE INVENTION

Figure 1:
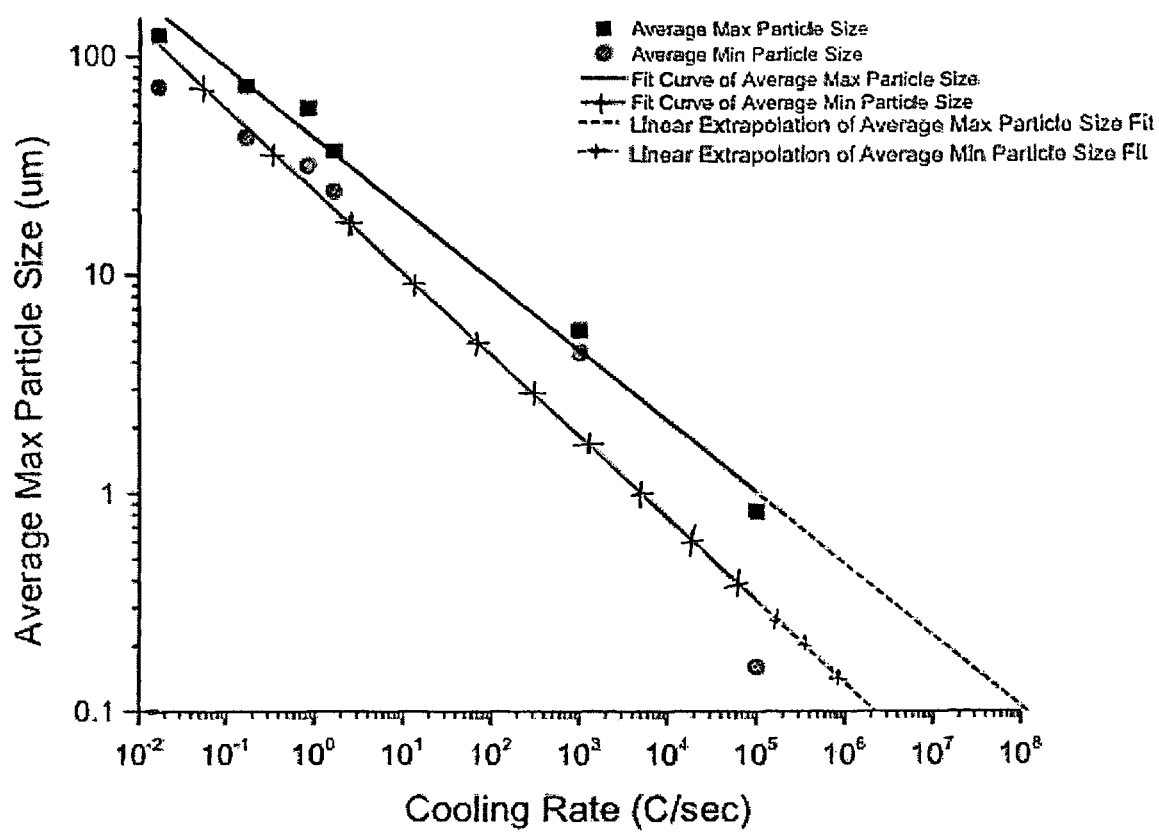
FIG. 1 is a graph illustrating the effect of cooling rate (from the superheat temperature of 1200° C.) on average maximum and minimum particle sizes of $Cu_{33}Al_{17}$ phase particles in the as-solidified matrix of two similar Sn—Cu—Al solder alloys (Sn-1.25Cu-0.20Al and Sn-3.0Cu-0.40Al, in wt. %). The data from the 5 slowest cooling rates were produced from Sn-1.25Cu-0.20Al samples that were subject to DSC measurements using a Pegasus, heat flux, DSC 404C by Netzsch. Approximately 100 mg of the alloy wire was used for each DSC run and a linear heating rate of 10° C./min (0.17° C./s) was used to bring the sample up to 1200° C. A hold time of 10 min at 1200° C. was used and each sample was cooled to room temperature using linear cooling rates of 0.017, 0.17, 0.33, 0.83, 1.65 (C/s). The data for $1\times10^3$ C/s cooling rate was from the same alloy sample that was sealed in a quartz tube, in an argon atmosphere, and held at 1200° C., for 60 min during melting from elemental constituents (with periodic agitation) before being quenched in a water bath. The solder ingot was drawn into a 1.7 mm dia. wire for microstructural analysis. The data point for $1\times10^5$ C/s cooling rate was from a chill cast ingot sample of Sn-3.0Cu-0.4Al that was melted and held in a quartz tube in an argon atmosphere at 1200° C. for several seconds during melting. Then, Ar gas over-pressure ejected the alloy through a pre-made (0.8 mm dia.) orifice onto a Cu chill wheel that was rotating at 5 m/s.

For purposes of illustration, the present invention is described in connection with the rapid solidification of a Sn-optional Ag—Cu—Al solder alloy of the type described in copending U.S. patent application Ser. No. 13/066,748 filed Apr. 22, 2011, the teachings of which are incorporated herein by reference, although the invention can be practiced with other Sn—Cu—Al solder alloys with or without Ag or other alloying elements in a manner to impart the aforementioned beneficial properties thereto.

The Sn-optional Ag—Cu—Al solder alloys of copending patent application Ser. No. 13/066,748 are alloyed with aluminum to reduce the unusually high undercooling of SAC (Sn—Ag—Cu) solder joints described above, where there can be difficulty in nucleating Sn solidification as a pro-eutectic phase, especially during slow cooling, such as existing for ball grid array (BGA) joints. As mentioned above, increased undercooling of the solder joints can promote formation of undesirable pro-eutectic intermetallic phases, specifically $Ag_3Sn$ "blades," that tend to coarsen radically, leading to embrittlement of as-solidified solder joints for impact stresses. To this end, the present invention provides a solder alloy comprising Sn, Ag, Cu, and Al having an alloy composition controlled to provide a strong, impact- and thermal aging-resistant solder joint having beneficial microstructural features described below and substantially devoid of $Ag_3Sn$ blades. The solder alloy has a relatively low liquidus temperature and a narrow liquid-solid mushy zone for solderability.

In one embodiment, such solder alloys consist essentially of about 3 to about 4 weight % Ag, about 0.7 to about 1.7 weight % Cu, about 0.01 to about 0.25 weight % Al, and balance consisting essentially of Sn. The solder alloy preferably exhibits a relatively low solidus temperature of about 217° C.±1° C. and narrow liquid-solid mushy zone with a liquidus temperature not exceeding about 5° C., often less than 3° C., above the solidus temperature. Other alloying elements may be present in the solder alloy that do not substantially affect the melting temperature thereof.

A preferred solder alloy consists essentially of about 3.4 to about 3.6 weight % Ag, about 0.8 to about 1.1 weight % Cu, about 0.03 to about 0.20 weight % Al, and balance consisting essentially of Sn.

A still more preferred solder alloy consists essentially of about 3.45 to about 3.55 weight % Ag, about 0.9 to about 1.0 weight % Cu, about 0.04 to about 0.10 weight % Al, and balance consisting essentially of Sn.

A still more preferred solder alloy consists essentially of about 3.45 to about 3.55 weight % Ag, about 0.75 to about 1.0 weight % Cu, about 0.04 to about 0.15 weight % Al, and balance consisting essentially of Sn.

In another embodiment, such Pb-free solder alloy consists essentially of about 3 to about 4 weight % Ag, 0.95-y weight % Cu, and y weight % Al and balance consisting essentially of Sn wherein y is about 0.01 to about 0.25 weight %.

Another embodiment of the invention provides a still more preferred solder alloy consists essentially of about 3.45 to about 3.55 weight % Ag, about 0.80 to about 1.0 weight % Cu, about 0.10 to about 0.20 weight % Al, and balance consisting essentially of Sn, especially for BGA applications that involve thermal-mechanical fatigue environments, like avionics.

Such solder alloys also can be modified in composition to eliminate the Ag component for situations where higher solder melting alloys can be tolerated. Such modified solder alloy embodiments are described below and comprise a solder alloy consisting essentially of about 3.20-y weight % Cu, y weight % Al, and balance consisting essentially of Sn wherein y is about 0.15 to about 0.25 weight %.

An embodiment of the present invention provides a method of making a rapidly solidified solder alloy comprising Sn, Cu and Al, wherein the alloy composition together with the solder alloy superheat temperature and rapid cooling rate from the superheat temperature are controlled to provide a dispersion of hard Cu—Al intermetallic particles in the as-solidified solder alloy microstructure and wherein the particles are retained even after multiple solder reflow cycles often used in modern electronic assembly procedures to provide a particle strengthening to the solder joint microstructure as well as exert a grain refining effect on the solder joint microstructure. An impact- and thermal aging-resistant solder joint having beneficial microstructural features and completely devoid of $Ag_3Sn$ blades (due to the omission of Ag in the alloy composition) can be produced using the rapidly solidified solder product.

The rapidly solidified solder alloy product can be rapidly solidified in the form of thin ribbon, foil, flakes, fine wire, atomized spheres (typically for BGA assemblies), atomized particles/powder (typically for solder paste), or other forms.

For purposes of illustration and not limitation, a method embodiment of the invention involves heating the Sn-optional Ag—Cu—Al solder alloy to a superheat temperature above the liquidus temperature of the solder alloy high enough, preferably at least 50 degrees C. above the liquidus temperature, to produce a homogeneous (single phase) melt. For purposes of illustration and not limitation, for solder alloy comprising Sn-3.0Cu-0.4Al (in weight %), the liquidus temperature has been determined to be about 1080 degrees C. such that a preferred superheat temperature is about 50 degrees or more above that liquidus temperature.

The superheat temperature and time at that temperature are controlled to produce a homogenous, single phase melt of the solder alloy that can be subsequently rapidly solidified. For the above-mentioned solder alloy comprising Sn-3.0Cu-0.4Al, the superheat temperature and time at that temperature can be 1200 degrees C. for 30 minutes to produce a homogeneous, single phase melt of the solder alloy. The melting and heating of the solder alloy to the superheat temperature can be conducted in an atmosphere including, but not limited to, ultra-high purity (99.99%) Ar gas.

Typically, elemental alloying elements of the solder alloy are placed in a crucible, such as an alumina crucible, or other melting vessel, and melted and heated by any suitable heating method/apparatus, such as by induction heating using one or more induction coils, electrical resistance heating using heating elements, gas firing, and the like to achieve the superheat temperature. Alternatively, the alloying elements can be placed in the crucible in the form of prealloyed crucible charge components (e.g. a binary Sn—Cu alloy, Cu—Al alloy, etc.) and then melted and heated to the desired superheat temperature. The Examples set forth below provide exemplary melting and heating parameters for a solder alloy comprising Sn-3.0Cu-0.4Al, for purposes of further illustration and not limitation.

The superheated melt then is rapidly solidified at a cooling rate high enough to produce an as-solidified solder alloy having a dispersion of Cu—Al intermetallic particles, such as for example relatively hard $Cu_{33}Al_{17}$ particles, in a rapidly solidified solder alloy matrix. The $Cu_{33}Al_{17}$ particles are hard (e.g. 30-50 GPa hardness by a nano-indention hardness test) compared to the matrix hardness (0.2 GPa hardness by same test). The Cu—Al particles preferably have an average maximum particle size (major dimension such as diameter) of 1 micron or less, preferably from about 0.1 to less than 1 micron average maximum particle size, even more preferably from about 0.1 to about 0.5 micron average maximum particle size. The rapidly solidified solder alloy matrix can have a cellular or dendritic solidification microstructure with a micron-scale grain size.

Such Cu—Al intermetallic particles form first upon rapid cooling through the particular phase field (e.g. the $Cu_{33}Al_{17}$ phase field) and subsequently nucleate $Cu_6Sn_5$ phase (apparent from microstructural evidence), which in turn nucleates the Sn dendritic phase. Such Cu—Al intermetallic particles are retained in the solder joint microstructure even after multiple solder reflow cycles often used in modern electronic assembly procedures to provide a particle strengthening effect to the solder joint as well as exert a grain refining effect on the solder joint. An impact- and thermal aging-resistant solder joint having beneficial microstructural features and completely devoid of $Ag_3Sn$ blades (from an absence of Ag in the alloy) can be produced using the rapidly solidified solder.

Rapid cooling rates greater than $1\times10^3$ degrees C./second, preferably at least about $1\times10^4$ to about $1\times10^6$ degrees C./second and greater preferably are used to this end. For example, referring to FIG. 1, the dependence of particle size on cooling rate is shown for 2 Sn—Cu—Al solder alloys comprising Sn-1.25Cu-0.20Al and Sn-3.0Cu-0.4Al (weight %). The former alloy was used for generating samples (in a DSC) from linear cooling rates of 0.017, 0.17, 0.33, 0.83, 1.65 (C/s) and for generating a (water quenched) chill cast alloy sample at an uncontrolled cooling rate of about $1\times10^3$ C/second that were subject to quantitative metallography to determine the size ranges of $Cu_{33}Al_{17}$ particles that are shown in FIG. 1, all of which are far greater than 1 micron. The later alloy (Sn-3.0Cu-0.4Al) was melt spun at a wheel speed of 5 m/second (about $1\times10^5$ degrees C./second) and was shown to produce dispersed $Cu_{33}Al_{17}$ intermetallic particles having a size of less than 1 micron. A cooling rate of $1\times10^6$ degrees C./second or greater is predicted by FIG. 1 to produce dispersed $Cu_{33}Al_{17}$ intermetallic particles having a size of about 0.1 to about 0.5 micron. To achieve the cooling rate of $1\times10^5$ degrees C./second, the solder alloy was melt spun using the apparatus shown in FIG. 2 and parameters of Example 1 pursuant to the invention.

In FIG. 1, the effects on the desired intermetallic phase size at the rapid cooling rates of about $1\times10^4$ to about $1\times10^6$ degrees C./second and greater employed in practice of the present invention are contrasted to the effects at the much slower cooling rate of about $1\times10^3$ degrees C./second that is typically associated with water quenching as described in connection with FIG. 1. It is apparent from the figure that the effect of the water quenching cooling rate (1-2 orders of magnitude slower than the preferred cooling rates) on the size of the desired intermetallic particles is very significant, increasing the size of the particles by at least 5 times. The effects on the desired intermetallic particle size of the much slower cooling rates, below of about $2\times10^0$ degrees C./second and less, are also shown for purposes of comparison where the minimum average diameter of about 25 microns is far above the 1 micron average maximum diameter produced at the lower end of the cooling rate range of this invention. The values from these much slower cooling rates are precisely labeled, since these samples were cooled at a controlled linear rate in an automated DSC system.

Figure 2:
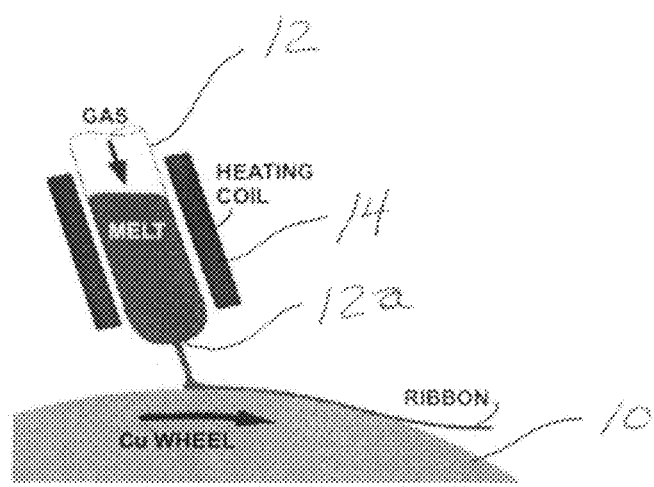
FIG. 2 illustrates a copper wheel melt spinning apparatus to produce the melt spun ribbon of Example 1.
Figure 3A:
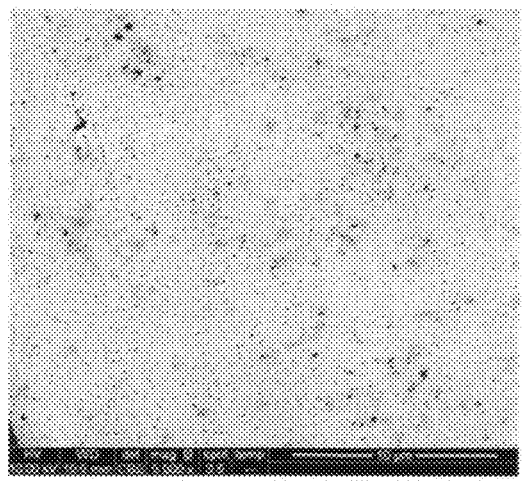
FIG. 3a (low magnitude) and FIG. 3b (higher magnitude) contain SEM photomicrographs in backscattered image mode of a representative as-solidified microstructure of the particular Sn-3.0Cu-0.4Al melt spun (at 5 m/sec) showing the dispersion of $Cu_{33}Al_{17}$ phase particles (see arrow for example) in the as-rapidly solidified solder alloy matrix with 0.2 µm average particle diameter in this field of view.
Figure 3B:
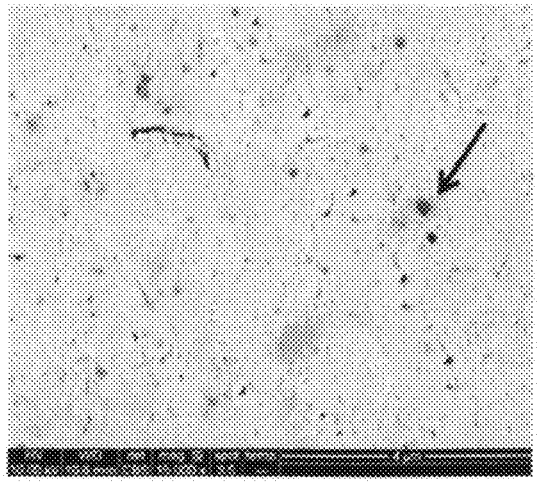

In practicing the present invention, a melt spinning process can be used to achieve cooling rates of $1\times10^4$ degrees C./second and above using a rotatable copper wheel 10, FIG. 2, cooled by mass quenching (using the heat capacity of the heavy copper wheel) and rotated at different wheel speeds to vary the cooling rate achievable. For most typical experimental melt spinning (small total melt quantities, about 5-10 g) higher wheel speeds provide higher cooling rates at a given (starting) wheel temperature and solder alloy superheat temperature and discharge rate on the wheel. For larger melt quantities, active wheel cooling is typically employed. In our experiments, the molten solder alloy at the superheat temperature is discharged onto the rotating copper wheel 10 at a controlled rate and wheel speed to form rapidly solidified solder alloy ribbon or foil typically having a thickness in the range of 25 to 50 microns for purposes of illustration and not limitation. The parameters of melt spinning, such as wheel speed (e.g., very high speeds, above 30 m/second) or wheel surface finish (with scribed line patterns) also can be controlled to fragment and rapidly solidify the melt in a manner to form rapidly solidified solder alloy flake particles having flake particle sizes within a controllable size distribution. FIG. 2 illustrates a copper wheel 10 to produce the melt spun ribbon of Example 1.

The parameters of melt spinning can be chosen to achieve and vary the desired cooling rate to form the desired Cu—Al intermetallic particles in the rapidly solidified solder alloy matrix, see FIG. 1. The Examples set forth below provide exemplary melt spinning parameters for a solder alloy comprising wheel speeds of 5-25 m/second with a smooth wheel surface for purposes of further illustration but not limitation.

The present invention can also be practiced by gas atomization processes to achieve typical cooling rates of $1 \times 10^5$ degrees C./second, typically ranging up to $1 \times 10^6$ degrees C./second and above, to produce fine solder alloy powder particles within controlled powder particle size distributions (e.g. particle size range of 1 to 100 microns) wherein the solder alloy melt stream at the superheat temperature is atomized by gas jets or a gas curtain discharged from a gas atomizing nozzle so that the melt is atomized into small particles which are rapidly cooled at the desired preferred cooling rate of at least $1 \times 10^4$ degrees C. or greater. For purposes of illustration and not limitation, high pressure gas atomization processes and apparatus for practicing the invention are described in U.S. Pat. Nos. 5,125,574; 5,228,620; and 6,142,382, the teachings of which are incorporated herein by reference to this end, although other atomization apparatus and processes can be used.

The parameters of gas atomization can be chosen to achieve and vary the desired cooling rate to form the desired Cu—Al intermetallic particles in the rapidly solidified solder alloy matrix, see FIG. 1. For example, such gas atomization parameters as gas manifold (upstream supply) pressure that controls the gas velocity in the melt disintegration zone and gas mass flow rate relative to melt flow rate that promotes atomization process uniformity can be varied to this end.

Practice of the present invention is not limited to melt spinning processes and gas atomization processes since other rapid solidification processes can be employed including, but not limited to, melt drip/quench atomization to produce small spheres (about 500 microns or less) and melt surface extraction to produce fine wire or filaments, to achieve a cooling rate high enough to produce an as-solidified solder alloy having a dispersion of Cu—Al intermetallic particles, such as for example hard $Cu_{33}Al_{17}$ particles, in a rapidly solidified solder alloy matrix wherein the Cu—Al particles preferably have an average maximum particle size (major dimension such as diameter) of 1 micron or less, preferably from about 0.1 to less than 1 micron average maximum particle size, even more preferably from about 0.1 to about 0.5 micron average maximum particle size.

The beneficial properties of rapidly solidified solder alloy embodiments of the invention provide several advantages for solder assembly of electronic circuits and electrical systems. In the type of solder paste reflow and ball grid array (BGA) applications that are envisioned for use with the Sn—Ag—Cu—Al solder, every single degree of reduced reflow temperature is a precious advantage for reducing damage to temperature sensitive electronic components and to the circuit board material, itself. In fact, a reason that SAC solder came into broad use as a Pb-free alternative to Sn—Pb solder is that the minimum reflow temperature of SAC solder for most applications, about 240° C., is just below the threshold for significant damage of one of the most popular circuit board materials, a fiberglass/epoxy composite, i.e., FR-4. Thus, the rapidly solidified Sn—Ag—Cu—Al solder alloy pursuant to the present invention should permit a more comfortable margin for preventing thermal damage of most components and common circuit board materials while producing an impact- and thermal aging-resistant solder joint having beneficial microstructural features discussed above and substantially devoid of $Ag_3Sn$ blades.

The rapidly solidified Sn—Ag—Cu—Al solder alloy of the type discussed above produces a solder joint having a microstructure that comprises tin dendrites, interdendritic multi-phase ternary eutectic (between the tin dendrites), and pro-eutectic $Cu_6Sn_5$ particles adjacent and/or within the tin dendrites and that is devoid of $Ag_3Sn$ blades as described in copending U.S. patent application Ser. No. 13/066,748 filed Apr. 22, 2011, the teachings of which are incorporated herein by reference. The as-solidified solder joint microstructure includes an interfacial layer comprising $Cu_6Sn_5$ and preferably an adjacent metastable, intermediate Al-containing rejected solute region as a zone of intermediate hardness between the hard, brittle interfacial layer and the softer tin matrix of the solder microstructure to provide a beneficial hardness gradient therebetween. The interfacial layer resides between the copper substrate and the solder of the solder joint.

This microstructure is achievable at the relatively slow cooling rates employed for solder paste reflow and BGA solder processing. The controlled dispersion of hard Cu—Al intermetallic particles in the as-solidified solder alloy microstructure of the solder alloy are retained even after multiple solder reflow cycles often used in modern electronic assembly procedures to provide a particle strengthening effect to the solder joint microstructure as well as to exert a grain refining effect on the solder joint microstructure. For example, the $Cu_{33}Al_{17}$ intermetallic particles are retained primarily in either the tin matrix or $Cu_6Sn_5$ phases of the solidified solder joint. An impact- and thermal aging-resistant solder joint having beneficial microstructural features and substantially devoid of $Ag_3Sn$ blades thereby can be produced using the rapidly solidified solder product.

The solder joint is formed by the rapidly solidified solder alloy being melted and solidified on an electrical wiring board and/or about copper electrical conductors in illustrative embodiments of the invention by various conventional soldering processes including, but not limited to, solder paste reflow and BGA attachments. A thermally-aged solder joint (e.g. aged for 1000 hours at 150° C.) will have an interfacial layer thickness that is about the same as the thickness as the interfacial layer thickness in the as-solidified solder joint condition (e.g. no more than 30% greater in thickness). As a result, the solder joint is resistant to thermal aging-induced embrittlement.

EXAMPLE

The following Example is offered to illustrate practice of the invention is more detail without limiting the scope of the invention.

Example 1

Figure 4:
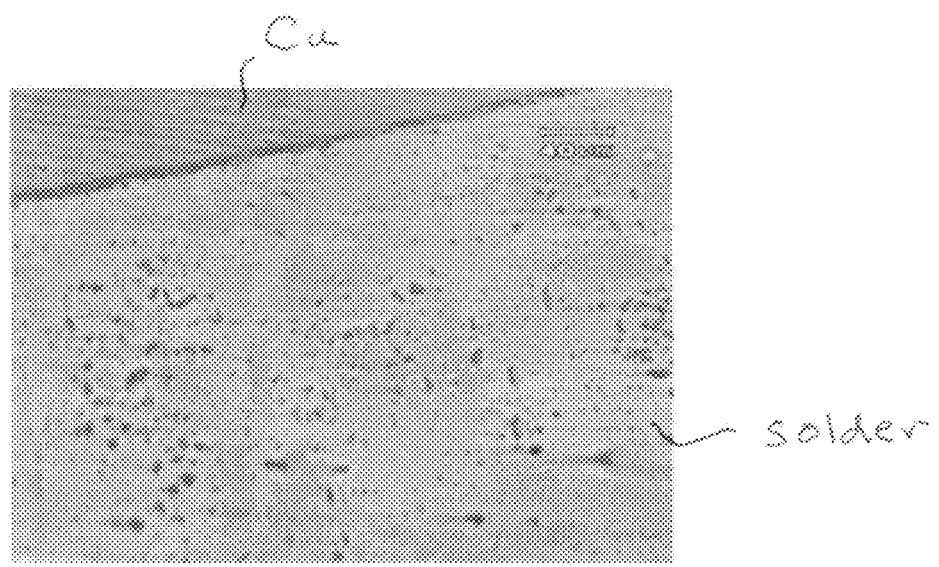
FIG. 4 is an optical photomicrograph of a representative as-solidified microstructure of a solder joint on a Cu substrate (Cu substrate is in the top portion) made from the Sn-3.0Cu-0.4Al melt spun ribbon (at 5 m/sec) showing (at this lower magnification) the interfacial $Cu_6Sn_5$ intermetallic phase attached to the substrate and an array of pro-eutectic $Cu_6Sn_5$ phase that is thought to be associated with $Cu_{33}Al_{17}$ phase particles with 0.2 µm average particle diameter.

The data point for $1 \times 10^5$ C/s cooling rate in FIG. 1 was from a chill cast ingot sample of Sn-3.0Cu-0.4Al (weight %) that was held and melted (using an induction heating coil 14, FIG. 2) in a quartz tube (melting vessel) 12 in an argon atmosphere at 1200° C. for several seconds during melting. The induction coil was a water-cooled copper tube operating at a frequency greater than 10 kHz. Surface tension effects of the liquid melt prevent any leaking before the solder alloy melt is forced out of the tube orifice by sudden application of the Ar over-pressure of about 20 psi applied to the top of the solder alloy melt to eject the solder alloy melt through a pre-made tube orifice 12a (0.8 mm diameter tube hole) onto a Cu chill wheel 10 that was rotating at 5 m/second. In this same manner, melt spun ribbon of the same solder alloy was made by ejecting the melt onto a copper wheel that was spinning a 25 m/second. The ribbons from the 5 m/second and the 25 m/second runs were mounted in epoxy and polished to a mirror finish for metallographic examination. At this time, microstructural analysis, including a quantitative analysis of the average size of the intermetallic Cu—Al particles, has been performed only on the 5 m/second ribbon sample on an FEI field emission SEM, since the spatial resolution limits are well within the resulting particle sizes that were imaged. The results of this analysis are shown in FIG. 1 for the cooling rate of about $1 \times 10^5$ C/second, which is estimated to be about the cooling rate for this wheel speed. The 5 m/second ribbon sample was also used to produce a prototype solder joint with a fluxed copper substrate by reflowing to a peak temperature of 250 C and cooling at a rate of 0.17 C/second, typical of BGA solder joints. An optical photomicrograph of this solder joint is included in FIG. 4 and shows (at lower magnification) the interfacial $Cu_6Sn_5$ intermetallic phase attached to the Cu substrate and an array of darker pro-eutectic $Cu_6Sn_5$ phase regions that are thought to be associated with $Cu_{33}Al_{17}$ phase particles with 0.2 μm average particle diameter.

While the invention has been described in terms of specific embodiments thereof, those skilled in the art will appreciate that modifications and changes can be made thereto within the scope of the appended claims.

We claim:

1. A solder comprising an alloy comprising aluminum, copper, optionally silver, and tin with copper present in an amount of about 0.7 to about 3.5 weight %, with aluminum present in an amount of 0.10 to 0.25 weight %, with silver optionally present in an amount of about 3 to about 4 weight %, and with the balance of the solder alloy consisting essentially of tin, said solder including, before solder reflow, a dispersion of $Cu_{33}Al_{17}$ intermetallic particles in a solder alloy matrix whose largest particle dimension, averaged, is about 0.1 micron to about 0.5 micron.

2. The solder of claim 1 in the form of a solder ball before solder reflow.

3. The solder of claim 1 in the form of a solder ribbon or foil before solder reflow.

4. The solder of claim 1 wherein the alloy consists essentially of about 3 to about 4 weight % Ag, about 0.7 to about 1.7 weight % Cu, and about 0.10 to about 0.25 weight % Al, and balance consisting essentially of Sn.

5. The solder of claim 1 wherein the alloy also intentionally comprises about 3 to about 4 weight % Ag.

6. A solder comprising a Sn—Cu—Al alloy consisting essentially of about 3.2 minus y weight % Cu, y weight % Al, and balance consisting essentially of Sn wherein y is about 0.15 to about 0.25 weight %, said solder including, before solder reflow, a dispersion of $Cu_{33}Al_{17}$ intermetallic particles in a solder alloy matrix whose largest particle dimension, averaged, is about 0.1 micron to about 0.5 micron.

* * * * *